(12) United States Patent
Bauer

(10) Patent No.: US 8,304,814 B2
(45) Date of Patent: Nov. 6, 2012

(54) POWER SEMICONDUCTOR DEVICE

(75) Inventor: Friedhelm Bauer, Semione (CH)

(73) Assignee: ABB Research Ltd, Zürich (CH)

( * ) Notice: Subject to any disclaimer, the term of this patent is extended or adjusted under 35 U.S.C. 154(b) by 0 days.

(21) Appl. No.: 13/172,054

(22) Filed: Jun. 29, 2011

(65) Prior Publication Data

US 2012/0001199 A1     Jan. 5, 2012

(30) Foreign Application Priority Data

Jun. 30, 2010   (EP) ................................. 10167819

(51) Int. Cl.
*H01L 27/118* (2006.01)

(52) U.S. Cl. ............ 257/205; 257/77; 257/139; 257/76; 257/197; 257/351; 257/E29.171; 257/E29.089; 257/E29.082

(58) Field of Classification Search ............ 257/77, 257/76, 139, E29.171, E29.089, E29.082 257/197, 205, 351
See application file for complete search history.

(56) References Cited

U.S. PATENT DOCUMENTS
5,202,750 A    4/1993   Gough

OTHER PUBLICATIONS

European Search Report dated Nov. 22, 2010 for European Application No. 10167819.1.
Dae Won Kim et al., A dual trench gate emitter switched thyristor (DTG-EST) with dual trench gate electrode and different gate oxide thickness, Microelectronic Engineering 70, 2003, pp. 50-57.
M.S. Shekar et al., Trench Gate Emitter Switched Thyristors, Proc. of the 6th International Symposium on Power Semiconductor Devices and IC's Davos, Switzerland, May 31-Jun. 2, 1994, pp. 189-194.

*Primary Examiner* — Tan N Tran
(74) *Attorney, Agent, or Firm* — Buchanan Ingersoll & Rooney PC

(57) ABSTRACT

A bipolar power semiconductor device is provided with an emitter electrode on an emitter side and a collector electrode on a collector side. The device has a trench gate electrode and a structure with a plurality of layers of different conductivity types in the following order: at least one n doped source region, a p doped base layer, which surrounds the at least one source region, an n doped enhancement layer, a p doped additional well layer, an additional n doped enhancement layer, an additional p doped well layer, an n doped drift layer and a p doped collector layer. The trench gate electrode has a gate bottom, which is located closer to the collector side than the additional enhancement layer bottom.

25 Claims, 8 Drawing Sheets

POWER SEMICONDUCTOR DEVICE

RELATED APPLICATION

This application claims priority under 35 U.S.C. §119 to European Patent Application No. 10167819.1 filed in Europe on Jun. 30, 2010, the entire content of which is hereby incorporated by reference in its entirety.

FIELD

The present disclosure relates to the field of power electronics and more particularly to a power semiconductor device.

BACKGROUND INFORMATION

In the document "A dual gate emitter switched thyristor (DTG-EST) with dual trench gate electrode and different gate oxide thickness" by D. Kim et al, Microelectronic Engineering 70 (2003), pp. 50-57, a conventional emitter switched thyristor (EST) with a trench gate structure is described. With reference to FIG. 1, this EST is a bipolar power semiconductor device 1' which includes an emitter electrode 11 on an emitter side 12 of a wafer, and a collector electrode 15 on a collector side 16 of the wafer. The collector side 16 lies opposite to the emitter side 12 on the wafer. The EST includes an n-doped source region 3 and a p-doped base layer on the emitter side 12. The trench gate electrode 2 is arranged in the same plane as the base layer 4 and it is electrically insulated from the source region 3 and the base layer 4 by an insulation layer 25. An n-doped enhancement layer 5, a p-doped well layer 6 and a drift layer 7 are arranged in succession on the base layer 4. A p-doped collector layer 8 is arranged on the drift layer 7 towards the collector side 16 and contacts the collector electrode 15.

The layers are arranged in planes parallel to the emitter side 12 and each layer includes a bottom, which is the maximum distance to which the layer extends from the emitter side 12. The p-doped well layer 6 includes a well layer bottom 611, which is closer to the emitter side 12 than the gate bottom 211.

The n-doped enhancement layer 5 is floating, whereas the base layer 4 and the well layer 6 are connected in a third dimension and thereby shorted.

The EST has a turn-on MOSFET between the enhancement layer 5, the well layer 6 and the drift layer 7. A turn-off MOSFET is formed between the source region 3, the base layer 4 and the floating enhancement layer 5.

The trench EST designs as shown in FIG. 1 are based on introducing an n-type enhancement layer 5 at the MOS cell to allow a thyristor operation with a lowest possible on-state voltage drop. I In this case, the enhancement layer acts as a floating n-type emitter layer with doping up to and exceeding 1018 cm-3. Weaker doping of the enhancement layer causes the trench EST to operate in its IGBT mode characterized by an increase of the on-state voltage and the gradual emergence of collector current saturation. In this design case, the enhancement layer acts to improve the carrier spreading and to increase the PIN effect. To obtain current saturation in a trench EST up to high collector-emitter voltages and a large safe operating area (SOA), the doping of the enhancement layer must be limited to levels close to 1016 cm-3. However, this limits the trench EST performance at a level comparable to conventional trench insulated gate bipolar transistors (IGBTs) employing n-type enhancement layers. In a trench IGBT, the enhancement layer 5 introduces a peak electric field near the junction thus limiting the avalanche capability of the device.

SUMMARY

An exemplary embodiment of the present disclosure provides a bipolar power semiconductor device which includes: (i) an emitter electrode arranged on an emitter side; (ii) a collector electrode arranged on a collector side, which lies opposite to the emitter side; (iii) a trench gate electrode and a structure with a plurality of layers of different conductivity types, where the trench gate electrode and the layers are arranged in planes parallel to the emitter side and each comprising a bottom, which is arranged in a maximum distance from the emitter side, to which the gate electrode or the layer extends, respectively; (iv) at least one source region of a first conductivity type which is arranged on the emitter side and which contacts the emitter electrode; (v) a base layer of a second conductivity type which is arranged on the emitter side, surrounds the at least one source region and contacts the emitter electrode and the at least one source region; (vi) a collector layer of the second conductivity type which is arranged on the collector side and which contacts the collector electrode; (vii) a drift layer of the first conductivity type arranged between the base layer and the collector layer; (viii) an insulation layer electrically insulating the trench gate electrode from the source region, the base layer and the drift layer, where the trench gate electrode is arranged in the same plane as the base layer, and the trench gate electrode includes a gate bottom; (ix) an enhancement layer of the first conductivity type and a well layer of the second conductivity type, which are arranged between the base layer and the drift layer, where the enhancement layer adjoins the base layer towards the collector side, and the well layer adjoins the enhancement layer towards the collector side; (x) a first additional well layer of the second conductivity type which adjoins the drift layer towards the emitter side; and (xi) a first additional enhancement layer of the first conductivity type which adjoins the first additional well layer towards the emitter side and which extends to an additional enhancement layer bottom. The gate bottom of the trench gate electrode is located closer to the collector side than the additional enhancement layer bottom.

BRIEF DESCRIPTION OF THE DRAWINGS

Additional advantages and features of the present disclosure are described in more detail below with reference to exemplary embodiments illustrated in the drawings, in which:

FIG. 15 shows an exemplary embodiment of a bipolar device with a repetitive arrangement of trench gate electrodes with well layers and enhancement layers in between.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
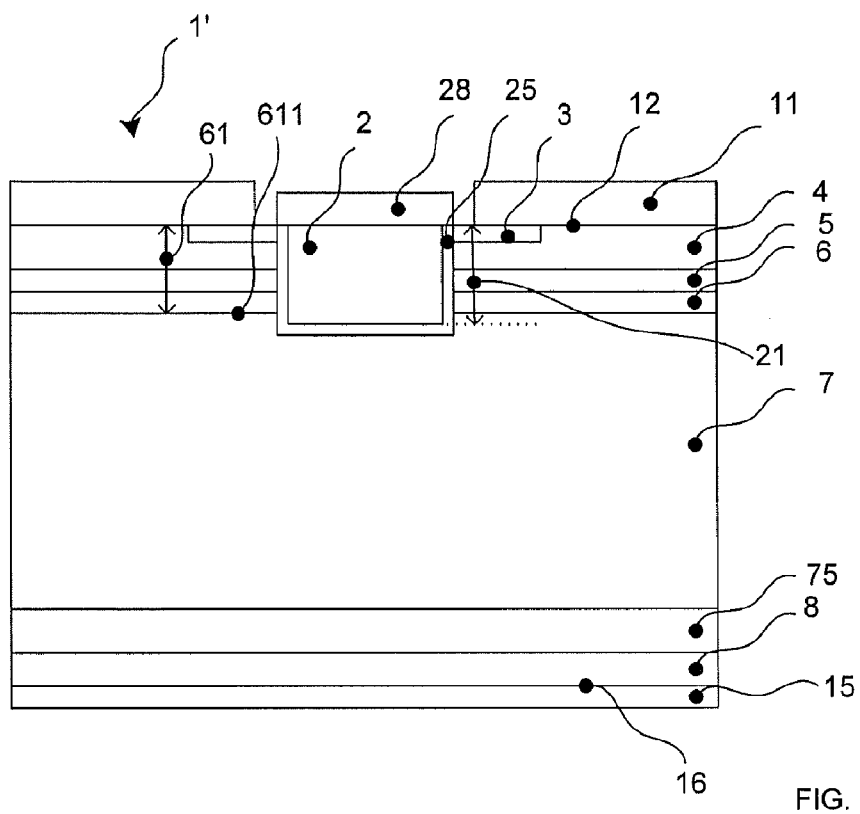
FIG. 1 shows a conventional trench emitter switched thyristor.

Exemplary embodiments of the present disclosure provide a bipolar power semiconductor device which overcomes the limitations of both trench EST and trench IGBT with respect to the trade-off between on-state voltage and collector current saturation (also referred to as short-circuit capability). For instance, exemplary embodiments of the present disclosure provide a device with low on-state voltage and current saturation at the same time.

An exemplary embodiment of the present disclosure provides a bipolar power semiconductor device which includes an emitter electrode and a gate electrode on an emitter side and a collector electrode on a collector side, respectively. The collector side lies opposite to the emitter side. The device has a structure with a plurality of layers of different conductivity types. The trench gate electrode and the layers are arranged in planes parallel to the emitter side each includes a bottom, which is arranged in a maximum distance, to which the layer extends, from the emitter side. The device includes the following layers:

(i) at least one source region of a first conductivity type, which is arranged on the emitter side and which contacts the emitter electrode;

(ii) a base layer of a second conductivity type opposite to the first conductivity type, where the base layer is arranged on the emitter side, surrounds the at least one source region and contacts the emitter electrode and the at least one source region;

(iii) a collector layer of the second conductivity type, which is arranged on the collector side and which contacts the collector electrode;

(iv) a drift layer of the first conductivity type being arranged between the base layer and the collector layer;

(v) a trench gate electrode, which is arranged in the same plane as the base layer and includes a gate bottom, where the trench gate electrode is electrically insulated from the source region, the base layer and the drift layer by an insulation layer;

(vi) an enhancement layer of the first conductivity type and a well layer of the second conductivity type, which are arranged between the base layer and the drift layer, where the enhancement layer is a floating layer, which adjoins the base layer towards the collector side, and the well layer adjoins the enhancement layer towards the collector side;

(vii) an additional well layer, which adjoins the drift layer towards the emitter side; and (viii) an additional enhancement layer, which adjoins the additional well layer towards the emitter side and which includes an additional enhancement layer bottom.

In accordance with an exemplary embodiment, the gate bottom is located closer to the collector side than the additional enhancement layer bottom.

In accordance with an exemplary embodiment, the major portion of the semiconductor between two neighbored vertical trench walls is filled with a horizontally arranged stack of alternately doped layers. This stack can be regarded as a horizontal superjunction (SJ) system while its functionality in the device deviates from the operation of conventional SJ power devices. Note that the main current flow is substantially perpendicular with respect to orientation of the multitude of PN junctions. According to the principles of SJ drift layers, the dopings of the alternating layers of the first and second conductivity type (all well and enhancement) can be increased above the 1,017 cm-3 level without incurring the danger of premature breakdown. This is of particular importance along the vertical channels of the trench electrode where a MOS depletion layer is repeatedly formed during device operation. Designing the horizontal layer stack according to (or close to) SJ design rules (charge balance throughout the alternating doped layers) permits coupling of MOS channel pinch-off from the base layer to the depletion at the junction between well layer and drift layer. Such a design feature allows collector current saturation up to very high collector-emitter voltages. On the other hand, positive gate bias in the on-state puts the horizontal layer stack in a low-resistance state adding low ohmic resistivity (achieved with high layer doping) and low-level bipolar interaction (plasma, excess base charge) among the layers (same principle as in a conducting thyristor, however exceeding the common the four-layer limitation). Accordingly, the exemplary device of the present disclosure provides a very even, homogeneous current distribution in the mesa region between two trenches at minimum voltage drop and with minimal stimulation by a bipolar plasma. The exemplary device with additional enhancement and well layers shows, in comparison with the same geometrical properties and same technology (e.g. buffer layer) of a conventional IGBT, an advantageous on-state voltage, which is less than 1 V, compared to the conventional device with about 1.9 V, which is an improvement of about 50%. The well layer as well as the additional well layer closest to the collector layer of the exemplary device according to the present disclosure can be advantageously used to convert the horizontal SJ layer stack into a vertical SJ drift layer. With this option, turn-off losses of the exemplary device can be reduced by a factor of up to three.

The horizontally stacked super junction layers in the form of stacked enhancement layer(s) and well layer(s) in the MOS cell circumvent the peak electric field near the junction. By the repetitive introduction of an additional enhancement layer and additional well, the doping concentration for each layer can be enhanced so that the ohmic conductivity is enhanced and thereby better carrier spreading properties surpassing the possibilities of the conventional n-type enhancement layer below the trench IGBT p-base layer can be achieved. Thus, the on-state losses are reduced.

By having a high doping concentration of the additional enhancement layers, the plasma is spread (e.g., a multiple plasma spreading is achieved). Even in the source region and base layer part of the device and even in the additional enhancement layers formed as a mesa structure, the current flows mostly in a direction perpendicular to the emitter side, i.e. in a one dimensional direction.

In accordance with an exemplary embodiment, the exemplary device can also include one or more set(s) of further additional enhancement layer(s) and further additional well layer(s), which are stacked between the well layer and the additional enhancement layer. These layers further enhance the above mentioned effects.

According to an exemplary embodiment, the total conductivity of the MOS cells is a mix of ohmic and bipolar conduction with a very high share contributed by the ohmic part; this allows fast dynamics due to the low amount of emitter-side bipolar carrier modulation.

The feature of the additional enhancement layer(s) and addition well layer(s) can be combined with a super-junction structure, in which the additional well layer includes an additional well layer bottom, which is arranged closer to the collector side than the gate bottom. By having an additional well layer bottom close to the gate bottom or even closer to the collector side than the gate bottom, high peaking electric fields at the trench corner are reduced or even avoided, thereby further reducing switching losses of the device.

The layout of the stacked enhancement and well layers results in a coupling of the depletion at the top PN junction with the n-drift layer (vertical super junction base) depletion; the device can thus be designed to provide current saturation and short circuit capability.

Figure 2:
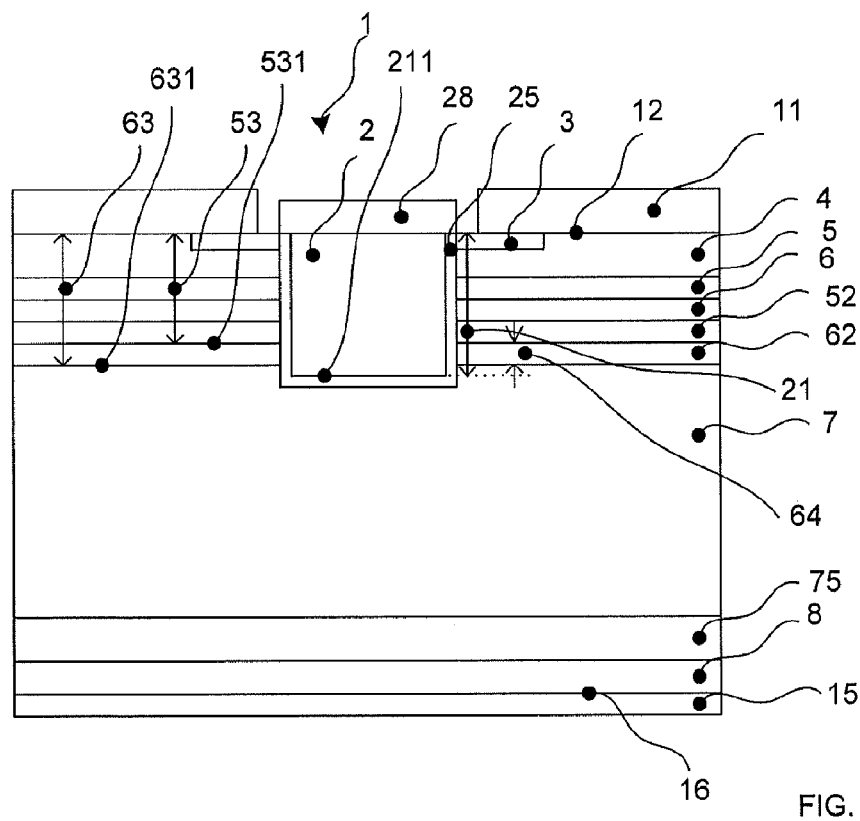
FIG. 2 shows an exemplary embodiment of a bipolar device.

FIG. 2 shows a bipolar power semiconductor device 1 according to an exemplary embodiment of the present disclosure. The bipolar power semiconductor device 1 includes an emitter electrode 11 arranged on an emitter side 12, and a collector electrode 15 arranged on a collector side 16, which lies opposite to the emitter side 12.

The device 1 has a trench gate electrode 2 and a structure with a plurality of layers of different conductivity types. The trench gate electrode 2 and layers are arranged in planes parallel to the emitter side 12 each including a bottom in a plane parallel to the emitter side 12, which is arranged in a maximum distance from the emitter side 12, to which the layer or gate extends.

The device 1 includes:
(i) at least one n doped source region 3 which is arranged on the emitter side 12 and which contacts the emitter electrode 11;
(ii) a p doped base layer 4 which is arranged on the emitter side 12, surrounds the at least one source region 3, and contacts the emitter electrode 11 and the at least one source region 3;
(iii) a p doped collector layer 8 which is arranged on the collector side 16 and which contacts the collector electrode 15;
(iv) an n doped drift layer 7 which is arranged between the base layer 4 and the collector layer 8,
(v) the trench gate electrode 2 which is arranged in the same plane as the base layer and comprises a gate bottom 211, where the trench gate electrode 2 is electrically insulated from the source region 3, the base layer 4 and the drift layer 7 by an insulation layer 25;
(vi) an n doped enhancement layer 5 and a p doped well layer 6, which are arranged between the base layer 4 and the drift layer 7,
wherein the enhancement layer 5 adjoins the base layer 4 towards the collector side 16, and the well layer 6 adjoins the enhancement layer 5 towards the collector side 16;
(vii) an additional p doped well layer 62 which adjoins the drift layer 7 towards the emitter side 12; and
(viii) an additional n doped enhancement layer 52, which adjoins the additional well layer 62 towards the emitter side 12 and which includes an additional enhancement layer bottom 531, which is the maximum distance from the emitter side 12, to which the additional enhancement layer 52 extends in an additional enhancement layer depth 53.

In accordance with an exemplary embodiment, the gate bottom 211 is located closer to the collector side 16 than the additional enhancement layer bottom 531.

The device 1 also includes an n doped buffer layer 75, which is arranged between the drift layer 7 and the collector layer 8. In accordance with an exemplary embodiment, the buffer layer 75 has a higher doping concentration than the drift layer 7.

As used herein, the phrase "same plane" means that there are overlapping planes (parallel to the emitter side), in which, for example, the trench gate electrode 2 and the base layer 4 are arranged, but the base layer 4 and gate electrode 2 do not need to have the same thickness.

The enhancement layer 5 and the additional enhancement layer 52 are floating layers, which are not connected to each other in the third dimension. The third dimension shall be a plane perpendicular to the emitter side 12.

Figure 14:
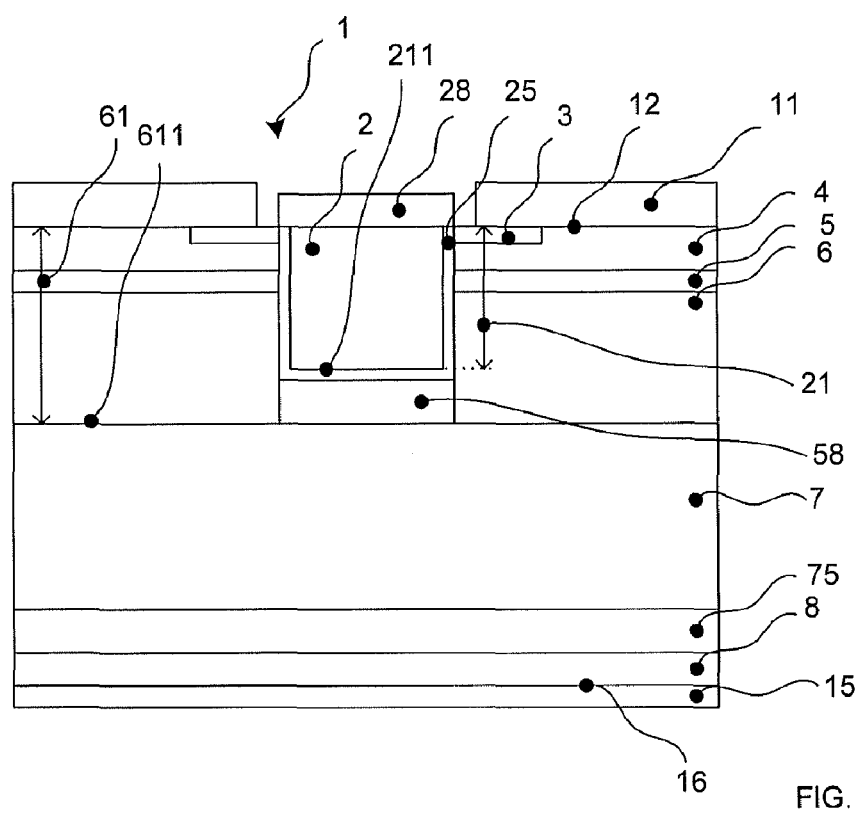
FIG. 14 shows an exemplary embodiment of a bipolar device with a well layer bottom, which is closer to the collector side than the gate bottom.
Figure 15:
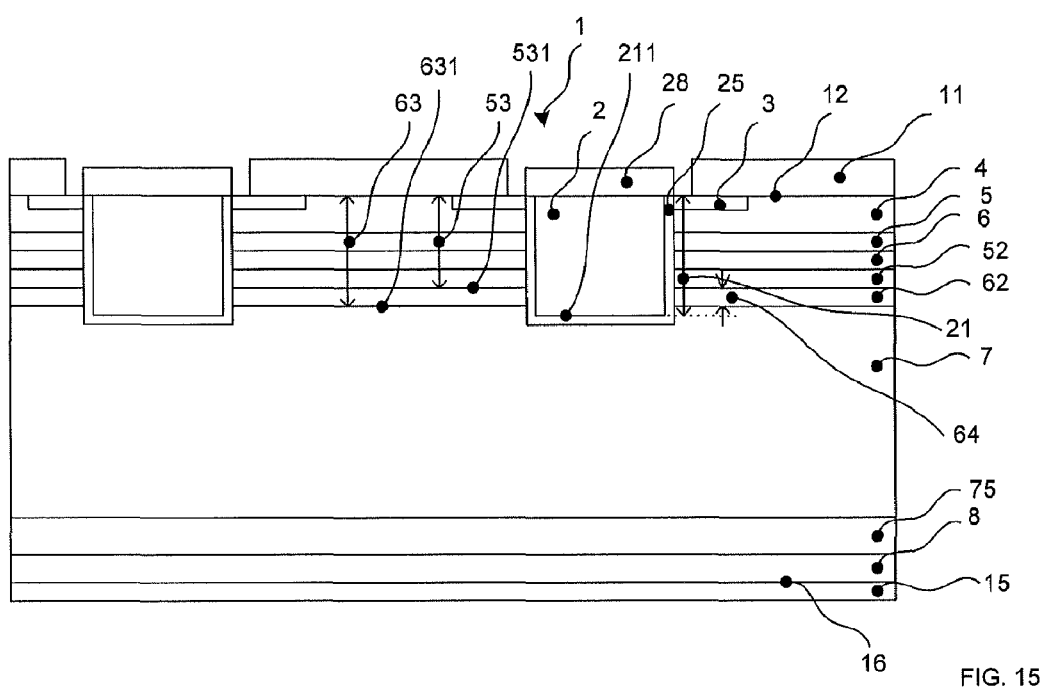

FIG. 15 shows an exemplary embodiment of a repetitive arrangement of trench gate electrodes 2 with the enhancement layers 5, 52 and well layers 6, 62 in between. The structure as shown in FIG. 2 or any of the FIGS. 3 to 14 may be repeated on one wafer so that the device 1 includes a plurality of two or more trench gate electrodes 2 with enhancement layers (e.g., enhancement layer 5, additional enhancement layer 52, and if present further additional enhancement layer(s) 55, 55') as well as well layers (e.g., well layer 6, additional well layer 62, and if present further additional well layer(s) 65, 65').

Figure 3:
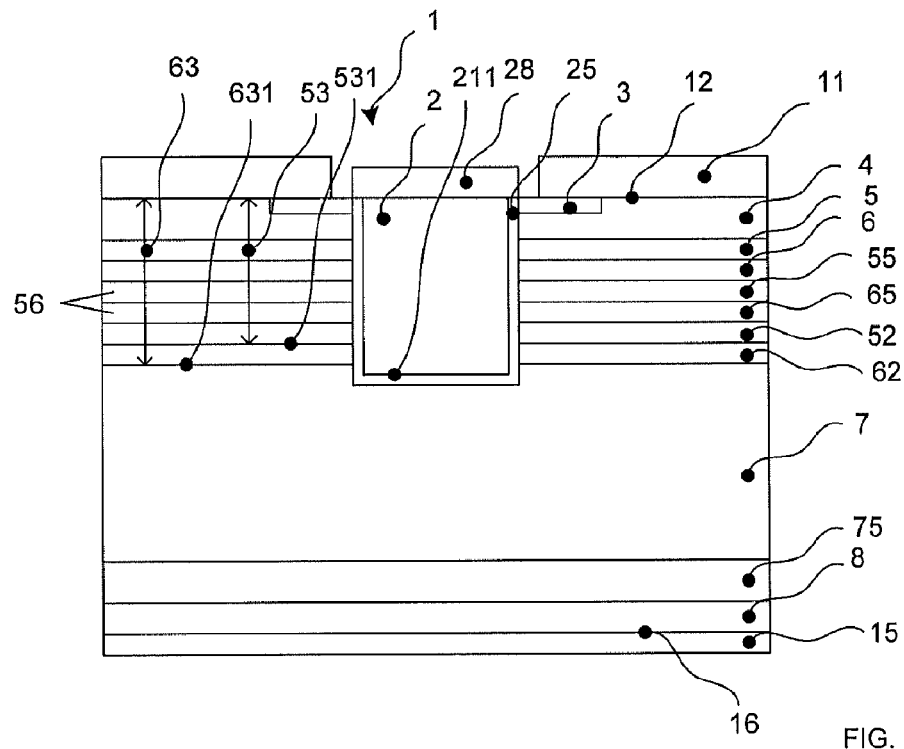
FIG. 3 shows an exemplary embodiment of a bipolar device with a set of a further additional enhancement layer and a further additional well layer.

FIG. 3 shows another exemplary embodiment of a device 1 which includes one set of a further additional enhancement layer 55 and a further additional well layer 65. The further additional enhancement layer 55 and the further additional well layer 65 are stacked between the well layer 6 and the additional enhancement layer 52. The further additional enhancement layer 55 is arranged closer to the emitter side 12 than the further additional well layer 65.

Figure 4:
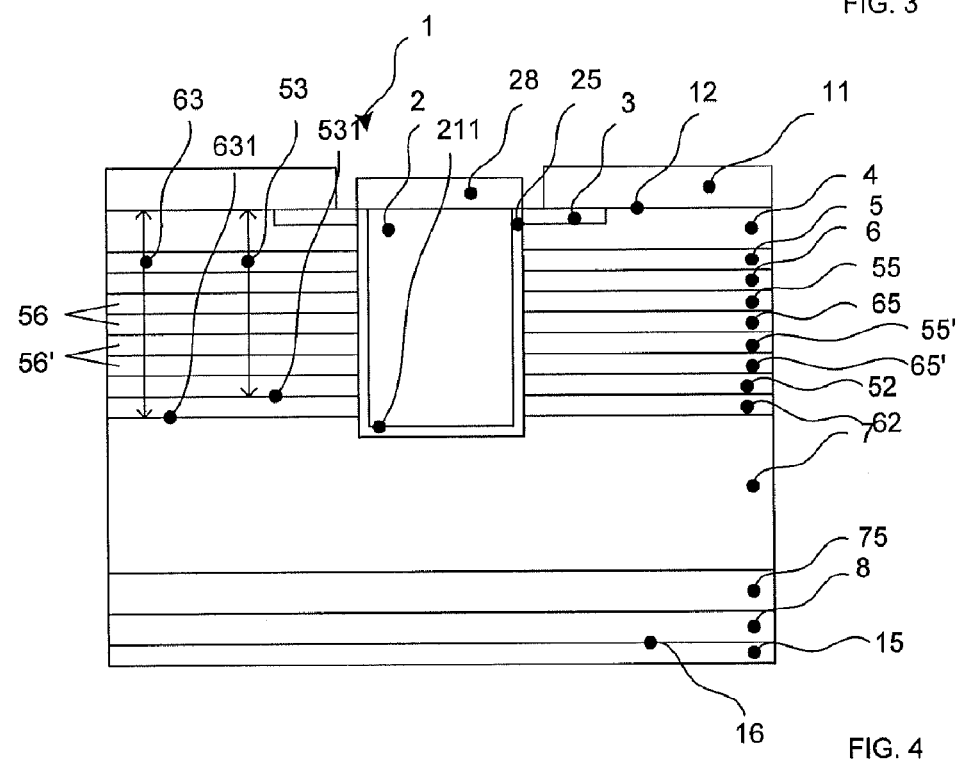
FIG. 4 shows an exemplary embodiment of a bipolar device with two sets of a further additional enhancement layer and a further additional well layer.
Figure 5:
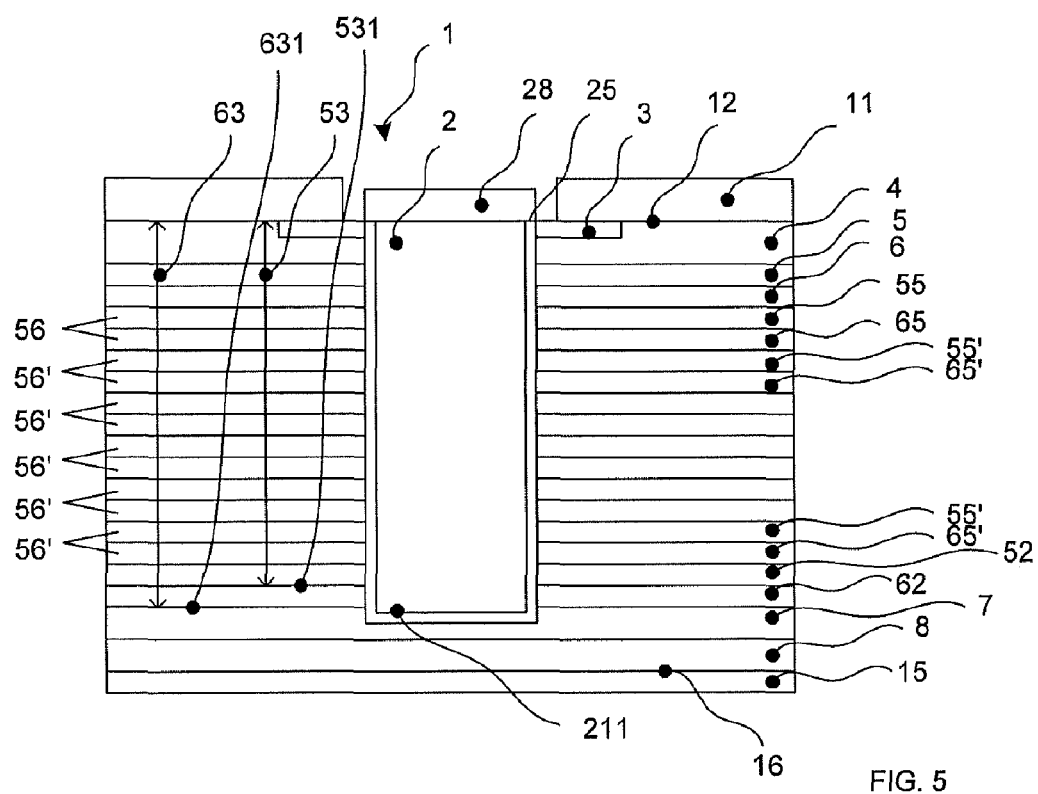
FIG. 5 shows an exemplary embodiment of a bipolar device with more sets of a further additional enhancement layer and a further additional well layer.

As shown in FIG. 4, the exemplary device 1 can also include two or, as shown in FIG. 5, more sets 56' of further additional enhancement layers 55 and further additional well layers 65. For each set 56, 56', the further additional enhancement layer 55 is arranged closer to the emitter side 12 than the further additional well layer 65. For all cases, an n doped layer is arranged between the trench gate electrode 2 and the collector layer 8 and thereby separates the collector layer 8 from the gate electrode 2.

The enhancement layer 5, the additional enhancement layer 52 and in case of a presence of a further additional enhancement layer 55 or further additional enhancement layers 55', these layers have a higher doping concentration than the drift layer 7.

Figure 6:
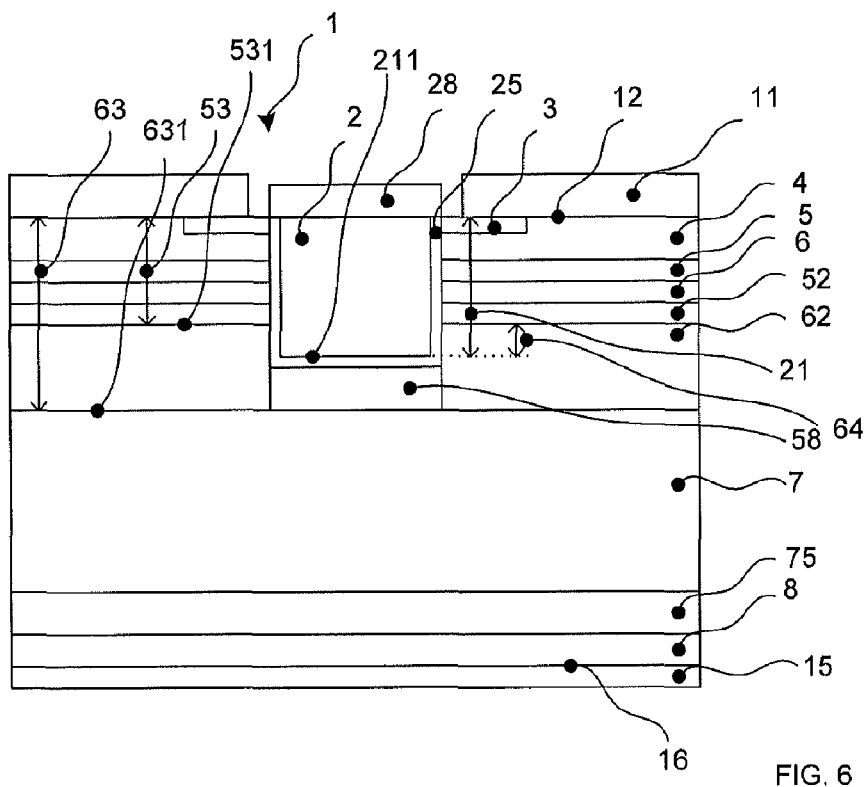
FIG. 6 shows an exemplary embodiment of a bipolar device with an additional well layer bottom, which is closer to the collector side than the gate bottom.

FIG. 6 shows another exemplary embodiment of a device 1 in which the additional well layer 62 includes an additional well layer bottom 631, which is arranged closer to the collector side 16 than the gate bottom 211. The additional well layer bottom 631 is the maximum distance from the emitter side 12, to which the additional well layer 62 extends in an additional well layer depth 63.

By having such a deep additional well layer 62, there is a space in between the insulation layer 25 at the of the trench gate bottom 211 and the drift layer 7. The gate bottom 211 is located in a gate depth 21. Thereby, a space is provided between the trench gate electrode 2 and the drift layer 7. In this space, which lies in orthogonal projection of the gate electrode 2 towards the collector side 16, e.g., between the gate electrode 2 and the drift layer 7, a connection layer 58 of the first conductivity type is arranged such that the connection layer 58 adjoins the insulation layer 25 and the drift layer 7 so that an n channel is formed between the trench gate electrode 2 and the drift layer 7. Due to the provision of such a deep additional well layer 52, the switching losses are reduced without influencing the on-state losses.

Figure 7:
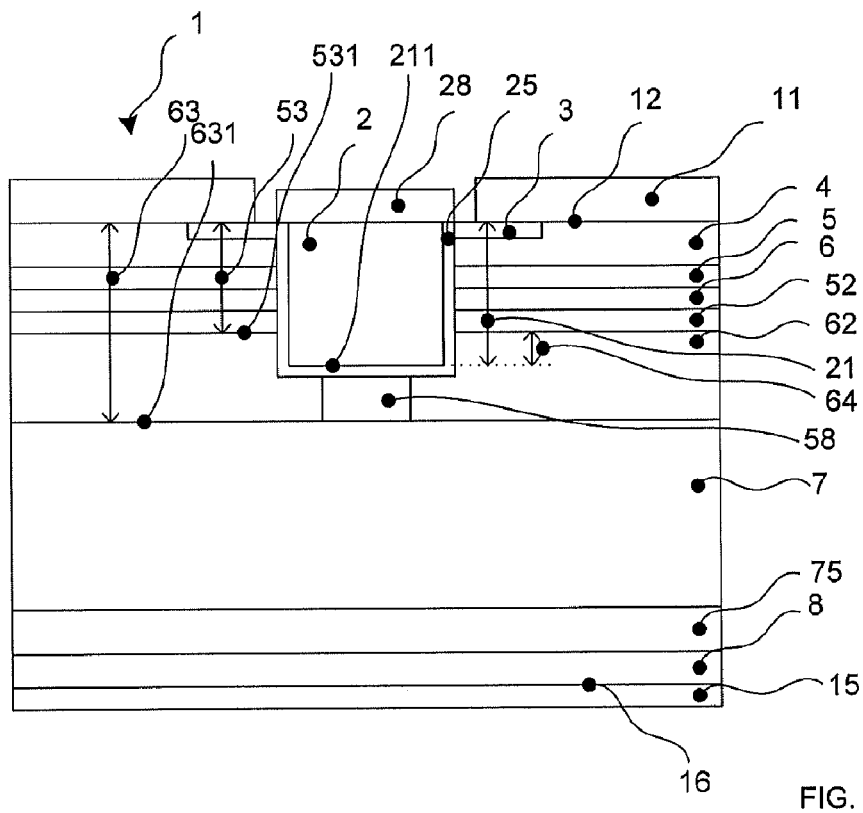
FIGS. 7 and 8 show exemplary embodiments of bipolar devices with an additional well layer bottom, which is closer to the collector side than the gate bottom and the additional well layer extending to a region between the gate electrode and the drift layer.
Figure 8:
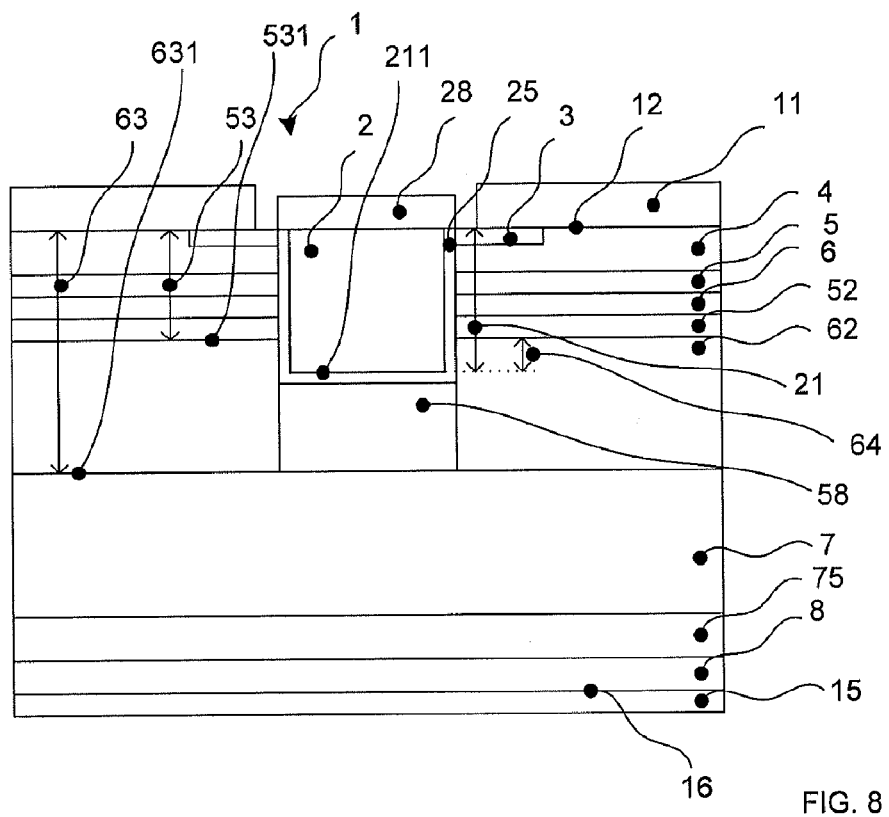

In FIG. 6, the connection layer 58 is arranged in the same plane as the additional well layer 62 within an area between the gate electrode 2 and the drift layer 7. In the exemplary embodiment of FIG. 6, the connection layer 58 has the same width as the insulation layer 25 at the lateral sides of the trench gate electrode 2 so that the additional well layer 62 is limited to an area lateral to the insulation layer 25. Alternatively, according to an exemplary embodiment, the connection layer 58 can have a smaller width as shown in FIG. 7 so that the additional well layer 62 extends into the area between the gate bottom 211 of the trench gate electrode 2 and the drift layer 7. Of course, the connection layer 58 may also have a larger width so that the connection layer 58 extends laterally to the trench gate electrode 2.

Figure 10:
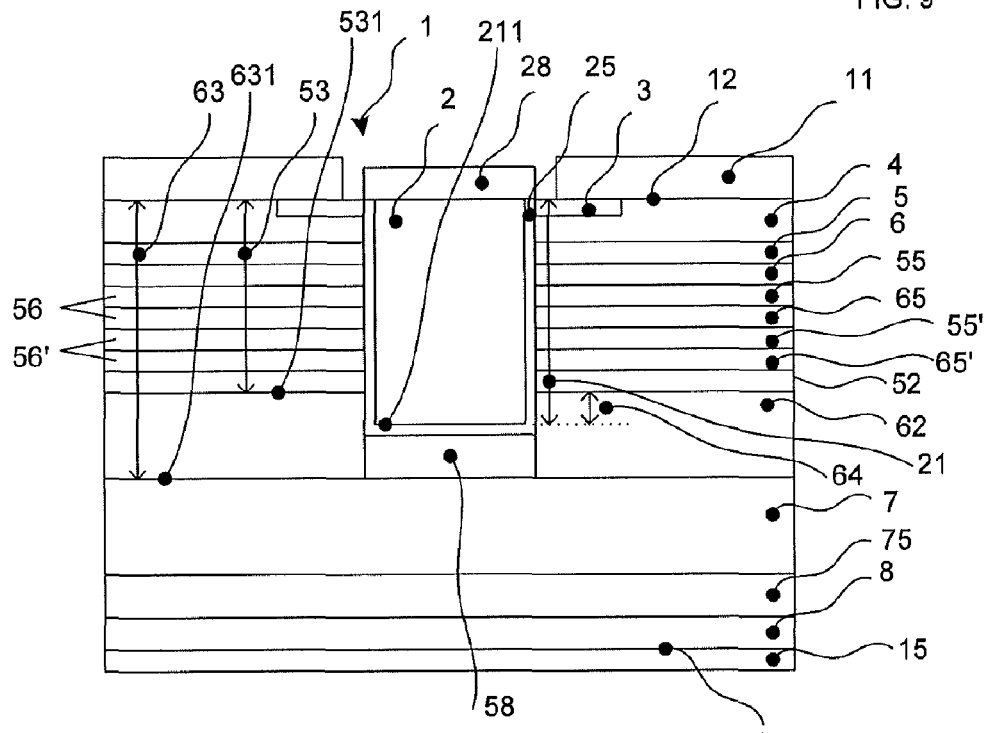
FIG. 10 shows an exemplary embodiment of a bipolar device with an additional well layer bottom, which is closer to the collector side than the gate bottom and a set of a further additional enhancement layer and a further additional well layer.
Figure 11:
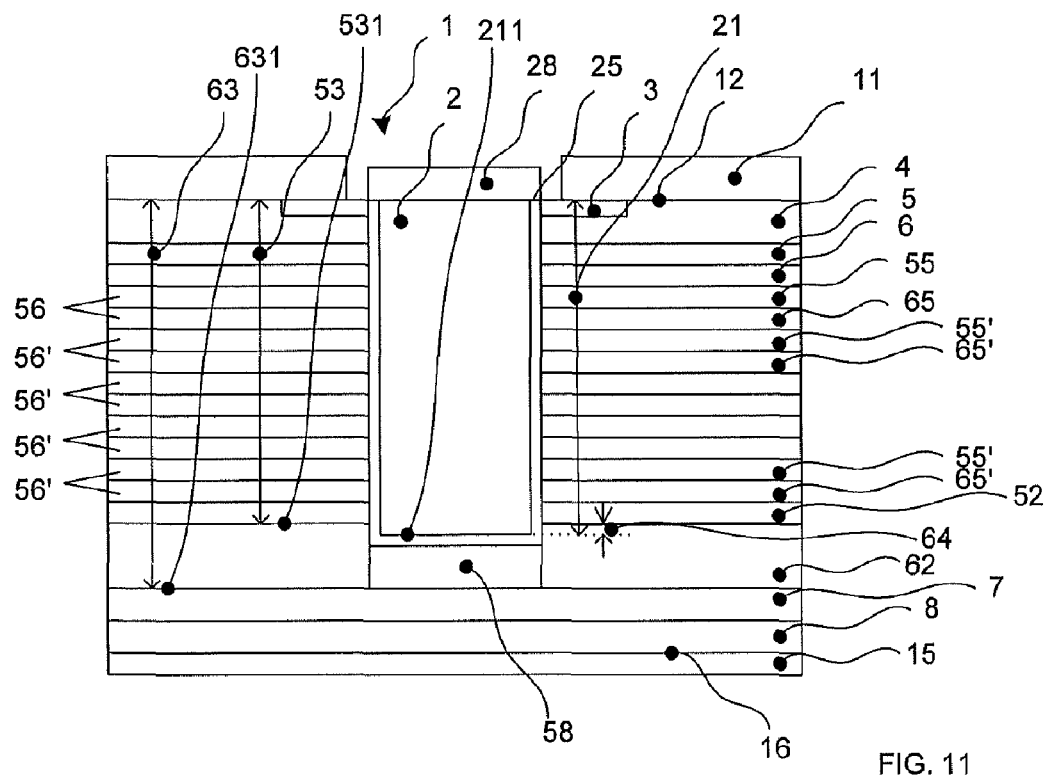
FIG. 11 shows an exemplary embodiment of a bipolar device with an additional well layer bottom, which is closer to the collector side than the gate bottom and a plurality of sets of a further additional enhancement layer and a further additional well layer.

In accordance with an exemplary embodiment, the device 1 includes a combination of the additional well layer bottom 631 being arranged closer to the collector side 16 than the gate bottom 211 and a set of further additional enhancement layer 55' and a further additional well layer 65' as shown in FIG. 10. As shown in the exemplary embodiment of FIG. 11, the space at the lateral sides of the trench gate electrode 2 can be completely filled with sets of further additional enhancement layers 55' and further additional well layers 65'.

Figure 9:
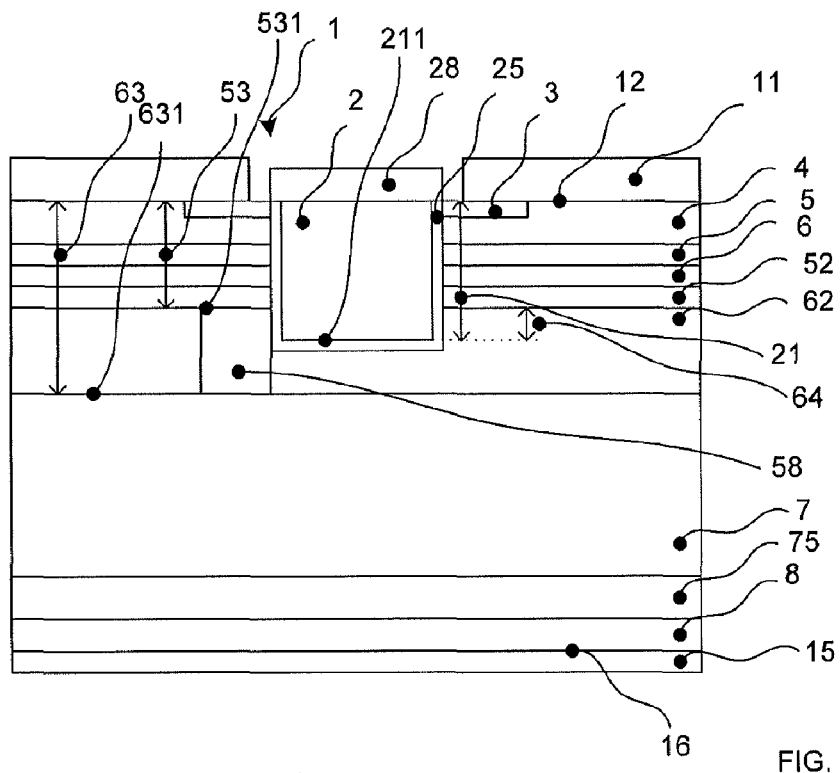
FIG. 9 shows an exemplary embodiment of a bipolar device with an additional well layer bottom, which is closer to the collector side than the gate bottom and a connection layer arranged lateral to the trench gate electrode and adjoining the trench gate electrode.

As an alternative to the arrangement of the connection layer 58 below the trench gate electrode 2, the connection layer 58 may be arranged lateral to the trench gate electrode, but adjoining the insulation layer 25 at such a place that it is arranged at a lateral side of the trench gate electrode 2 (FIG. 9). Also, in this case the connection layer 58 forms an n channel between the trench gate electrode 2 and the drift layer 7.

Figure 12:
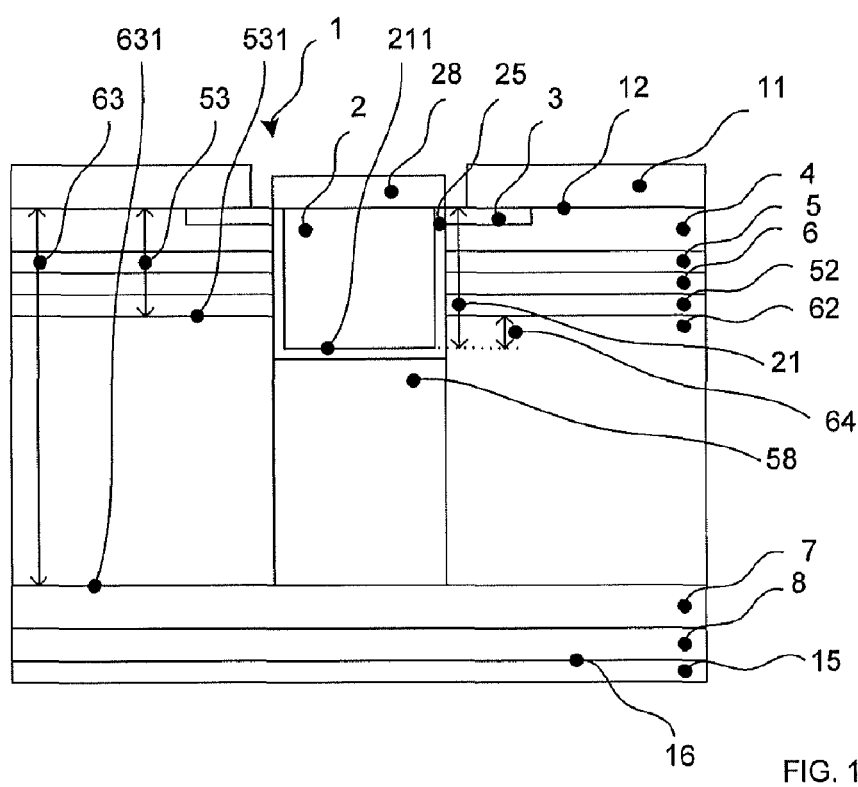
FIG. 12 shows an exemplary embodiment of a bipolar device without a buffer layer.

In the exemplary device 1 shown in FIG. 12, the drift layer 7 adjoins the collector layer 8 so that no buffer layer 75 is present.

Figure 13:
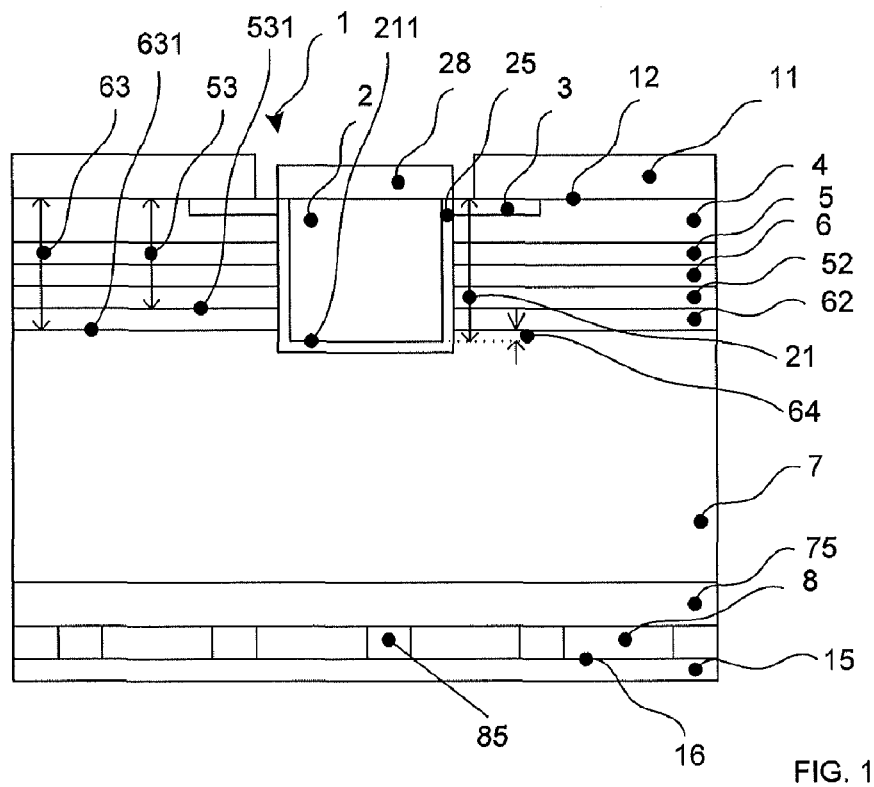
FIG. 13 shows an exemplary embodiment of a bipolar device with an anode layer being arranged sequential to the collector layer.

The device 1 may also be designed as a reverse-conducting bipolar device with an n doped anode layer 85, which is arranged in the same plane and sequential to the collector layer 8 and which has a higher doping concentration than the drift layer 7 (FIG. 13). The anode layer 85 may include a plurality of n doped zones, between which the collector layer 8 with a plurality of p doped zones is arranged. The n doped zones and the p doped zones, respectively, may include either interconnected zones or the zones are separated from each other by the layer of the other conductivity type. The total area of the anode layer 85 in a plane parallel to the collector side 16 can be, for example, less than 25%, less than 10% of the total area or even less than 5%. The total area is the sum of the area of the anode layer 85 and the collector layer 8.

In accordance with an exemplary embodiment, all enhancement layers (e.g., the enhancement layer 5, the additional enhancement layer 52 and if present the further additional enhancement layer(s) 55, 55') as well as all well layers (e.g., the well layer 6, the additional well layer 62 and if present the further additional well layer(s) 65, 65') may have the same thickness. The thickness of the additional well layer 64 is measured between the additional enhancement layer bottom 531 and at maximum up to the gate bottom 211. This means that if the additional well layer 62 has a bottom 631, which is farther from the collector side 16 than the gate bottom 211, the distance between the additional enhancement layer bottom 531 and the additional well layer bottom 631 is taken as the additional well layer thickness 64.

If the additional well layer 62 has a bottom 631, which is closer to the collector side 16 than the gate bottom 211, then the difference between the additional enhancement layer bottom 531 and the gate bottom 211 is taken as the additional well layer thickness 64.

In accordance with an exemplary embodiment, all enhancement layers 5, 52, 55, 55' and all well layers 6, 62, 65, 65' can have the same doping concentration. In this case, the doping concentration of the additional well layer 62 is measured between the additional enhancement layer bottom 531 and at maximum up to the plane, in which the gate bottom 211 is arranged. This means that if the additional well layer 62 has a bottom, which is farther from the collector side 16 than the gate bottom 211, the doping concentration is measured between the additional enhancement layer bottom 531 and the additional well layer bottom 641. The doping concentration of each enhancement/well layer may have a value of up to or even larger than 1,017 cm-3, for example.

If the additional well layer 62 has a bottom, which is located closer to the collector side 16 than the gate bottom 211, then the doping concentration is measured between the additional enhancement layer bottom 531 and the gate bottom 211.

In accordance with an exemplary embodiment, the sum of all products of the thickness $t_{ni}$ of the enhancement layers 5, 52, 55, 55' multiplied by their doping concentration $N_{ni}$ is the same by a factor k as the sum of all products of the thickness $t_{pi}$ of the well layers 6, 62, 65, 65' multiplied by their doping concentration $N_{pi}$. With the index "i" for the thickness and doping concentration, it is indicated that the thickness-doping concentration product of all enhancement layers, or well layers respectively is summed up.

The thickness and the doping concentration of the additional well layer 64 is measured between the additional enhancement layer bottom 531 and at maximum up to the plane, in which the gate bottom 211 is arranged, as already explained above.

$$\Sigma N_{pi} t_{pi} = k \Sigma N_{ni} t_{ni}$$

where k is a factor between 0.5 and 2. To achieve a higher equivalence between the dopants of the enhancement layers 5, 52, 55, 55' and the well layers 6, 62, 65, 65', the factor k can have a value between 0.67 and 1.5, for example.

In FIG. 14, another exemplary embodiment of a device 1 is shown which includes an enhancement layer 5 and a well layer 6. The enhancement layer 5 adjoins the base layer 4 towards the collector side 16, and the well layer 6 adjoins the enhancement layer 5 towards the collector side 16. In this case, the well layer 6 directly adjoins the drift layer 7. The well layer 6 has a bottom 611, which is the maximum distance from the emitter side 12, to which the well layer 6 extends in a well layer depth 61. The well layer bottom 611 is closer to the collector side 16 than the gate bottom 211. By having the well layer bottom 611 closer to the collector side 16 than the gate bottom 211, high peaking electric fields at the trench corner are reduced or even avoided, thereby reducing the switching losses of the device. If an additional enhancement layer 52 and well layer 62 is added to the device 1, this results in a device as shown in FIG. 6. The connection layer 58 can be designed according to the explanations given above (for example, with reference to FIGS. 6 to 9).

In accordance with an exemplary embodiment, any of the above-described devices 1 can be made on a basis of a Silicon or GaN or SiC wafer. For manufacturing of a bipolar device according to the present disclosure, a wafer exemplarily made of Silicon or GaN or SiC is provided. In or respectively on such a wafer, the layers can be formed by epitactical growing, implanting or deposition of particles followed by diffusion. For forming the trench gate electrode 2, the stacked enhancement layers 5, 52, 55, 55' and well layers 6, 62, 65, 65' are then locally removed to form gaps, in which the trench gate electrode is created afterwards.

In accordance with an exemplary embodiment, the above-described conductivity types of the various layers are switched. For example, all layers of the first conductivity type can be p type (e.g. the source region) instead of n type, as described above, and all layers of the second conductivity type can be n type (e.g. the base region) instead of p type, as described above.

It should be noted that the term "comprising" does not exclude other elements or steps and that the indefinite article "a" or "an" does not exclude the plural. Also, elements described in association with different embodiments may be combined. It should also be noted that reference signs in the claims shall not be construed as limiting the scope of the claims.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST 1 bipolar semiconductor device
1' prior art bipolar semiconductor device
11 emitter electrode
12 emitter side
15 collector electrode
16 collector side
2 trench gate electrode
21 gate depth
211 gate bottom
25 insulation layer
28 further insulation layer
3 source region
4 base layer
5 enhancement layer
52 additional enhancement layer
53 additional enhancement layer depth
55, 55' further additional enhancement layer
56, 56' set
58 connection layer
6 well layer
61 well layer depth
611 well layer bottom
62 additional well layer
63 additional well layer depth
631 additional well layer bottom
64 thickness of the additional well layer
65, 65' further additional well layer
7 drift layer
75 buffer layer
8 collector layer
85 anode layer

What is claimed is:

1. A bipolar power semiconductor device comprising:
an emitter electrode arranged on an emitter side;
a collector electrode arranged on a collector side, which lies opposite to the emitter side;
a trench gate electrode and a structure with a plurality of layers of different conductivity types, the trench gate electrode and the layers being arranged in planes parallel to the emitter side and each comprising a bottom, which is arranged in a maximum distance from the emitter side, to which the gate electrode or the layer extends, respectively;
at least one source region of a first conductivity type which is arranged on the emitter side and which contacts the emitter electrode;
a base layer of a second conductivity type which is arranged on the emitter side, surrounds the at least one source region and contacts the emitter electrode and the at least one source region;
a collector layer of the second conductivity type which is arranged on the collector side and which contacts the collector electrode;
a drift layer of the first conductivity type arranged between the base layer and the collector layer;
an insulation layer electrically insulating the trench gate electrode from the source region, the base layer and the drift layer, the trench gate electrode being arranged in the same plane as the base layer, and the trench gate electrode including a gate bottom;
an enhancement layer of the first conductivity type and a well layer of the second conductivity type, which are arranged between the base layer and the drift layer, the enhancement layer adjoining the base layer towards the collector side, and the well layer adjoining the enhancement layer towards the collector side;
a first additional well layer of the second conductivity type which adjoins the drift layer towards the emitter side; and
a first additional enhancement layer of the first conductivity type which adjoins the first additional well layer towards the emitter side and which extends to an additional enhancement layer bottom,
wherein the gate bottom of the trench gate electrode is located closer to the collector side than the additional enhancement layer bottom.

2. The device according to claim 1, comprising:
at least one set of at least one second additional enhancement layer and at least one second additional well layer, wherein the at least one second additional enhancement layer and the at least one second additional well layer are stacked between the well layer and the first additional enhancement layer, and wherein for each set, the at least one second additional enhancement layer is arranged closer to the emitter side than the at least one second additional well layer.

3. The device according to claim 2, wherein the at least one second additional enhancement layer has a higher doping concentration than the drift layer.

4. The device according to claim 2, wherein at least one of the enhancement layer and the first additional enhancement layer have a higher doping concentration than the drift layer.

5. The device according to claim 4, wherein a doping concentration of the first additional well layer is measured between the first additional enhancement layer bottom and at maximum up to the gate bottom, and wherein each enhancement layer and each well layer have the same doping concentration.

6. The device according to claim 4, wherein:

$$\Sigma N_{pi} t_{pi} = k \Sigma N_{ni} t_{ni}$$

Nni is a doping concentration of an enhancement layer;
Nni is a doping concentration of a well layer;
tpi, tni is a thickness of the enhancement and well layers, respectively;
k is a factor between 0.5 and 2 or between 0.67 and 1.5; and
a thickness and doping concentration of the first additional well layer is measured between the first additional enhancement layer bottom and at maximum up to the gate bottom.

7. The device according to claim 2, comprising:
an anode layer of the first conductivity type which has a higher doping concentration than the drift layer, and which is arranged in the same plane and sequential to the collector layer.

8. The device according to claim 7, comprising:
a buffer layer of the first conductivity type which is arranged between the drift layer and the collector layer.

9. The device according to claim 1, wherein at least one of the enhancement layer and the first additional enhancement layer have a higher doping concentration than the drift layer.

10. The device according to claim 9, wherein a doping concentration of the first additional well layer is measured between the first additional enhancement layer bottom and at maximum up to the gate bottom, and wherein each enhancement layer and each well layer have the same doping concentration.

11. The device according to claim 9, wherein:

$$\Sigma N_{pi} t_{pi} = k \Sigma N_{ni} t_{ni}$$

Nni is a doping concentration of an enhancement layer;
Nni is a doping concentration of a well layer;
tpi, tni is a thickness of the enhancement and well layers, respectively;
k is a factor between 0.5 and 2 or between 0.67 and 1.5; and
a thickness and doping concentration of the first additional well layer is measured between the first additional enhancement layer bottom and at maximum up to the gate bottom.

12. The device according to claim 1, wherein the first additional well layer extends to an additional well layer bottom, the additional well layer bottom being arranged closer to the collector side than the gate bottom, and wherein the device comprises a connection layer of the first conductivity type arranged to adjoin and thereby connect the insulation layer and the drift layer.

13. The device according to claim 12, wherein the connection layer is arranged in the same plane as the first additional well layer within an area between the gate electrode and the drift layer.

14. The device according to claim 13, wherein the first additional well layer extends into an area between the gate electrode and the drift layer.

15. The device according to claim 13, wherein the first additional well layer is limited to an area lateral to the insulation layer and adjoining the insulation layer.

16. The device according to claim 15, comprising:
an anode layer of the first conductivity type which has a higher doping concentration than the drift layer, and which is arranged in the same plane and sequential to the collector layer.

17. The device according to claim 16, comprising:
a buffer layer of the first conductivity type which is arranged between the drift layer and the collector layer.

18. The device according to claim 12, wherein a thickness of the first additional well layer is measured between the first additional enhancement layer bottom and at maximum up to the gate bottom, and wherein each enhancement layer and each well layer have the same thickness.

19. The device according to claim 1, comprising:
an anode layer of the first conductivity type which has a higher doping concentration than the drift layer, and which is arranged in the same plane and sequential to the collector layer.

20. The device according to claim 19, comprising:
a buffer layer of the first conductivity type which is arranged between the drift layer and the collector layer.

21. The device according to claim 1, comprising:
a buffer layer of the first conductivity type which is arranged between the drift layer and the collector layer.

22. The device according to claim 1, wherein a thickness of the first additional well layer is measured between the first additional enhancement layer bottom and at maximum up to the gate bottom, and each enhancement layer and each well layer have the same thickness.

23. The device according to claim 1, wherein
a doping concentration of the first additional well layer is measured between the first additional enhancement layer bottom and at maximum up to the gate bottom, and each enhancement layer and each well layer have the same doping concentration.

24. The device according to claim 1, wherein:

$$\Sigma N_{pi} t_{pi} = k \Sigma N_{ni} t_{ni}$$

Nni is a doping concentration of an enhancement layer;
Nni is a doping concentration of a well layer;
tpi, tni is a thickness of the enhancement and well layers, respectively;
k is a factor between 0.5 and 2 or between 0.67 and 1.5; and
a thickness and doping concentration of the first additional well layer is measured between the first additional enhancement layer bottom and at maximum up to the gate bottom.

25. The device according to claim 1, wherein the device is made on a wafer comprised of one of silicon, GaN and SiC.

* * * * *